United States Patent
Deppe et al.

(10) Patent No.: US 7,323,383 B2
(45) Date of Patent: Jan. 29, 2008

(54) METHOD FOR FABRICATING AN NROM MEMORY CELL ARRANGEMENT

(75) Inventors: Joachim Deppe, Dresden (DE); Christoph Kleint, Dresden (DE); Christoph Ludwig, Langebrück (DE)

(73) Assignee: Infineon Technologies AG, Munich (DE)

( * ) Notice: Subject to any disclaimer, the term of this patent is extended or adjusted under 35 U.S.C. 154(b) by 144 days.

(21) Appl. No.: 11/015,747

(22) Filed: Dec. 17, 2004

(65) Prior Publication Data
US 2005/0158953 A1   Jul. 21, 2005

Related U.S. Application Data

(63) Continuation of application No. PCT/DE03/02025, filed on Jun. 17, 2003.

(30) Foreign Application Priority Data
Jun. 17, 2002   (DE) ............... 102 26 964

(51) Int. Cl.
*H01L 21/336*   (2006.01)
(52) U.S. Cl. .............. 438/259; 438/279; 438/288; 438/589
(58) Field of Classification Search ........... 438/257, 438/259, 275–279, 288, 589
See application file for complete search history.

(56) References Cited

U.S. PATENT DOCUMENTS

| 5,071,782 | A | 12/1991 | Mori |
| 5,278,438 | A | 1/1994 | Kim et al. |
| 5,424,569 | A | 6/1995 | Prall |
| 5,768,192 | A | 6/1998 | Eitan |
| 6,011,725 | A | 1/2000 | Eitan |
| 6,025,626 | A | 2/2000 | Tempel |
| 6,136,716 | A * | 10/2000 | Tu ............................ 438/694 |
| 6,548,861 | B2 * | 4/2003 | Palm et al. ................. 257/330 |
| 6,777,725 | B2 * | 8/2004 | Willer et al. ................ 257/244 |
| 6,794,249 | B2 | 9/2004 | Palm et al. |
| 6,844,584 | B2 | 1/2005 | Palm et al. |

(Continued)

FOREIGN PATENT DOCUMENTS

DE    100 39 441 A1    2/2002

(Continued)

OTHER PUBLICATIONS

Tanaka, J., et al., "A Sub-0.1-μm Grooved Gate MOSFET with High Immunity to Short-Channel Effects," IEDM 1993, pp. 537-540.

(Continued)

*Primary Examiner*—Zandra V Smith
*Assistant Examiner*—Toniae M Thomas
(74) *Attorney, Agent, or Firm*—Slater & Matsil, L.L.P.

(57) ABSTRACT

In the method, trenches (9) are etched and, in between, bit lines (8) are in each case arranged on doped source drain/ regions (3). Dopant is introduced into the bottoms of the trenches (9) in order to form doped regions (23), in order to electrically modify the channel regions. Storage layers are applied and gate electrodes (2) are arranged at the trench walls. The semiconductor material at the bottoms of the trenches is etched away between the word lines (18/19) to an extent such that the doped regions (23) are removed there to such a large extent that a crosstalk between adjacent memory cells along the trenches is reduced.

11 Claims, 8 Drawing Sheets

U.S. PATENT DOCUMENTS

| | | | |
|---|---|---|---|
| 6,861,685 B2 * | 3/2005 | Choi | 257/288 |
| 7,026,687 B2 | 4/2006 | Shinozaki et al. | |
| 2005/0196923 A1 * | 9/2005 | Deppe et al. | 438/259 |

FOREIGN PATENT DOCUMENTS

| | | | |
|---|---|---|---|
| DE | 101 29 958 A1 | | 1/2003 |
| DE | WO 2003/105231 A1 * | | 12/2003 |
| DE | WO 2004/107435 A1 * | | 12/2004 |
| JP | 06-350095 | | 12/1994 |
| JP | 08-186183 | | 7/1996 |
| JP | 2001-501034 | * | 1/2001 |
| JP | 2003-309192 | | 10/2003 |
| JP | 2004-517464 | | 6/2004 |
| JP | 2004-531084 | | 10/2004 |
| WO | WO 98/13878 | | 4/1998 |
| WO | WO99/60631 A1 | | 11/1999 |
| WO | WO 02/15276 A2 | | 2/2002 |
| WO | WO 02/15278 A3 | | 2/2002 |
| WO | WO 03/001600 A2 | | 1/2003 |
| WO | WO 03/107416 A1 * | | 12/2003 |

OTHER PUBLICATIONS

Nakagawa, K., et al., "A Flash EEPROM Cell with Self-Aligned Trench Transistor & Isolation Structure," 2000 IEEE Symposium on VLSI Technology Digest of Technical Papers, 2 pages.

* cited by examiner

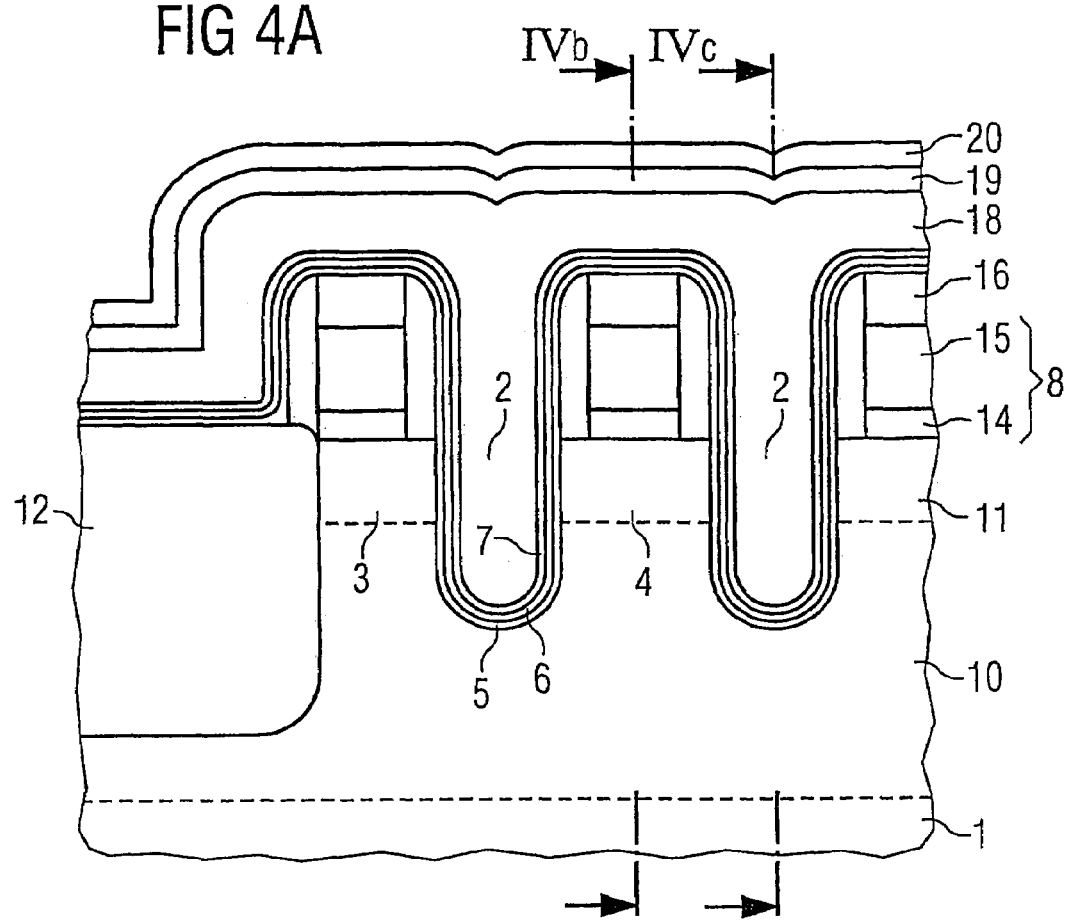

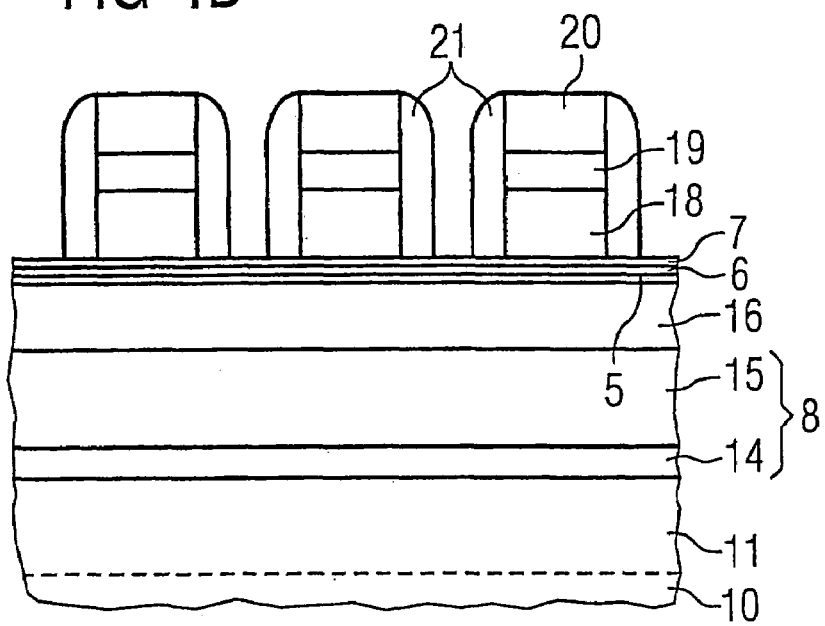
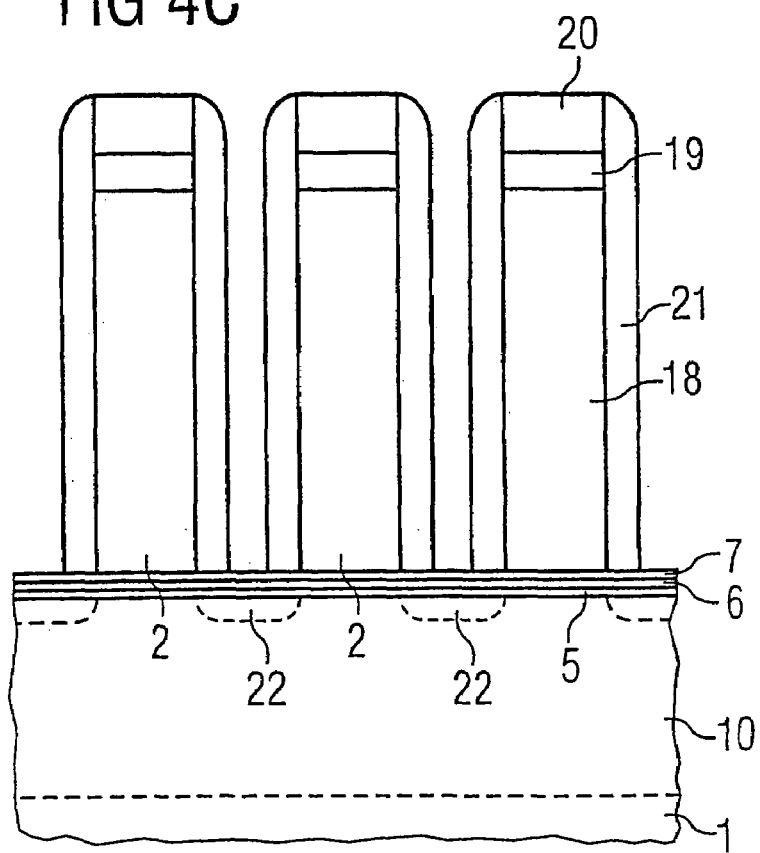

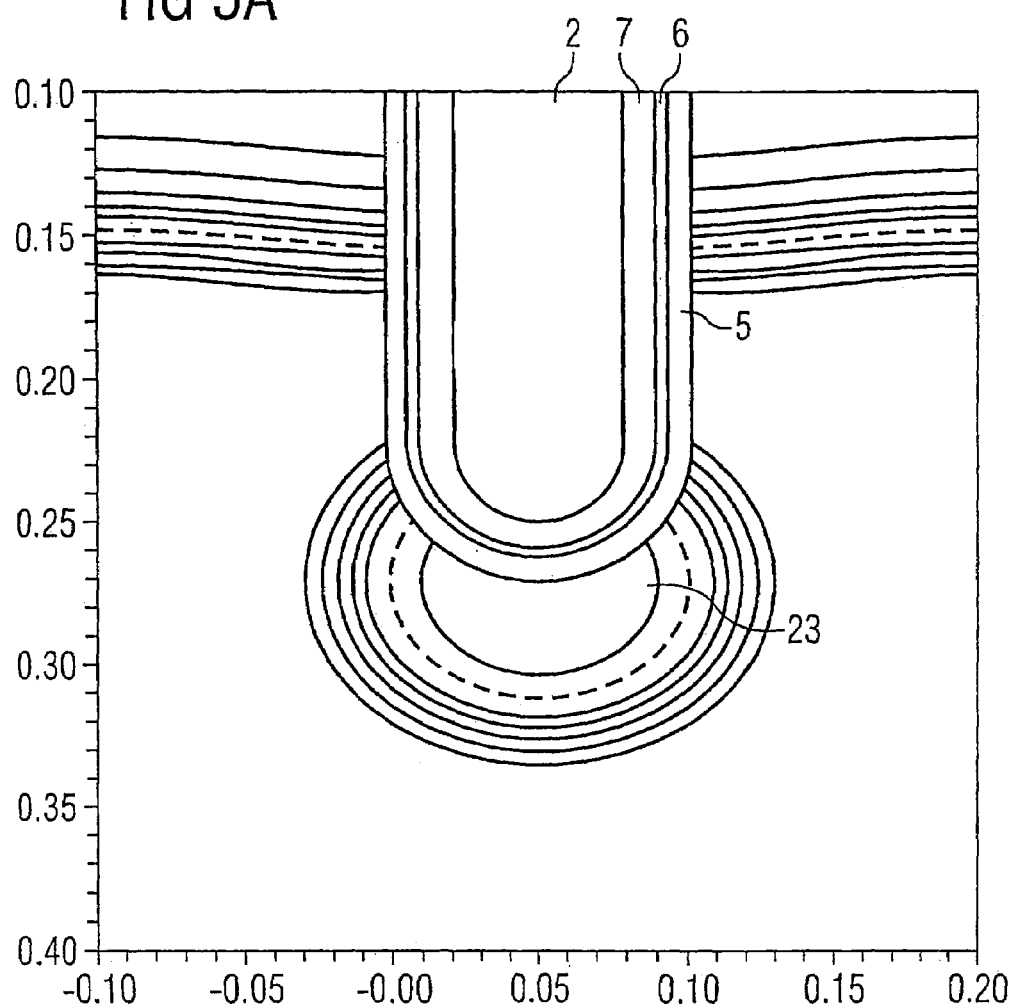

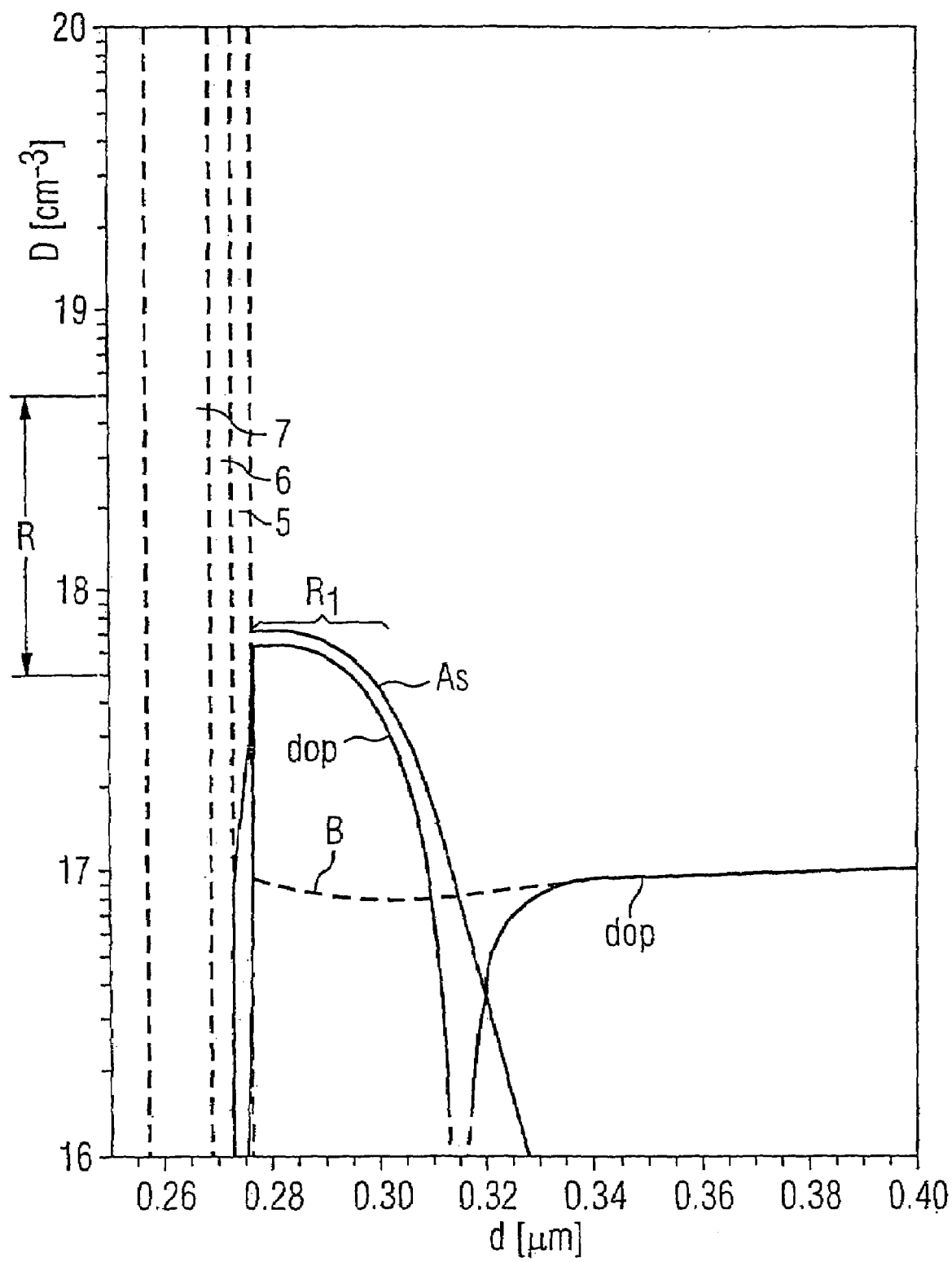

METHOD FOR FABRICATING AN NROM MEMORY CELL ARRANGEMENT

This application is a continuation of International Application No. PCT/DE03/02025, filed Jun. 17, 2003, which designated the United States and was not published in English, and which is based on German Application No. 102 26 964.5, filed Jun. 17, 2002, both of which applications are incorporated herein by reference.

TECHNICAL FIELD

The invention relates to the field of electrically writeable and erasable nonvolatile flash memories. It specifies a method for fabricating an NROM memory with an arrangement of nonvolatile memory cells constructed with an oxide-nitride-oxide storage layer, which can be used in a virtual-ground NOR architecture.

BACKGROUND

Extremely small nonvolatile memory cells are required for a very large scale integration density in multimedia applications. The further development of semiconductor technology is making possible increasingly larger storage capacities, which will very soon open up the gigabit range. However, while the minimum feature size determined by the lithography continues to decrease, other parameters, such as, e.g., the thickness of the tunnel oxide, can no longer be scaled correspondingly. The decrease in the channel length which accompanies the structural miniaturization in the case of planar transistors requires an increase in the channel doping in order to avoid the occurrence of a voltage breakdown—referred to as punch-through—between source and drain. This leads to an increase in the threshold voltage, which is usually compensated for by reducing the thickness of the gate oxide.

However, planar SONOS memory cells (see Boaz Eitan U.S. Pat. No. 5,768,192, U.S. Pat. No. 6,011,725, and WIPO Patent Application No. 99/60631) which are programmable by means of channel hot electrons and erasable by hot holes require a control dielectric having a thickness equivalent to a gate oxide. This thickness cannot be reduced arbitrarily, however, without the number of executable programming cycles ("endurance" of the memory cell) decreasing in an unacceptable manner. Therefore, a sufficiently large channel length is necessary in order that the dopant concentration in the channel does not have to be chosen to be excessively high, because otherwise the threshold voltage rises too much.

The publication by J. Tanaka et al.: "A Sub-0.1-μm Grooved Gate MOSFET with High Immunity to Short-Channel Effects" in IEDM 93, pp. 537-540 (1993), describes a transistor on a $p^+$-type substrate, in which the gate electrode is arranged in a trench between the $n^+$-type source region and the $n^+$-type drain region and a curved channel region is thus formed in the substrate.

The publication by K. Nakagawa et al.: "A Flash EEPROM Cell with Self-Aligned Trench Transistor & Isolation Structure" in 2000 IEEE Symposium on VLSI Technology Digest of Technical Papers describes a transistor as a memory cell with a floating gate electrode which is arranged between the $n^+$-type source region and the $n^+$-type drain region in a manner such that it reaches right into a p-type well of the substrate. A dielectric layer made of an oxide-nitride-oxide layer sequence is situated between the floating gate electrode and the control gate electrode.

SUMMARY OF THE INVENTION

It is an object of the present invention to specify how, in the case of the memory cell arrangement described in the introduction, it is possible to prevent a crosstalk between adjacent rows of memory cells.

This object is achieved by means of the method for fabricating an NROM memory cell array where trenches are etched and, in between, bit lines are in each case arranged on doped source drain/regions. Dopant is introduced into the bottoms of the trenches in order to form doped regions, in order to electrically modify the channel regions. Storage layers are applied and gate electrodes are arranged at the trench walls. The semiconductor material at the bottoms of the trenches is etched away between the word lines to an extent such that the doped regions are removed there to such a large extent that a crosstalk between adjacent memory cells along the trenches is reduced. Refinements are also provided.

In the method, the semiconductor material is etched away at the bottoms of the trenches in the region between the word lines to an extent such that the doped regions are removed there entirely or at least to such a large extent that a crosstalk between adjacent memory cells along the trenches is reduced to an envisaged extent. Preferably, the doped regions are completely etched away at the trench bottoms between the word lines. In the case of specific embodiments, however, it may suffice to remove at least the central region having high dopant concentrations in the lower part of the trenches.

BRIEF DESCRIPTION OF THE DRAWINGS

A typical example of the method is described in more detail below with reference to the accompanying figures.

FIGS. 1, 2a, 2b, 3, 4a, 4b and 4c show cross sections through intermediate products after different steps of a preferred fabrication method;

FIGS. 5a and 5b show diagrams concerning model calculations; and

Figure 0:
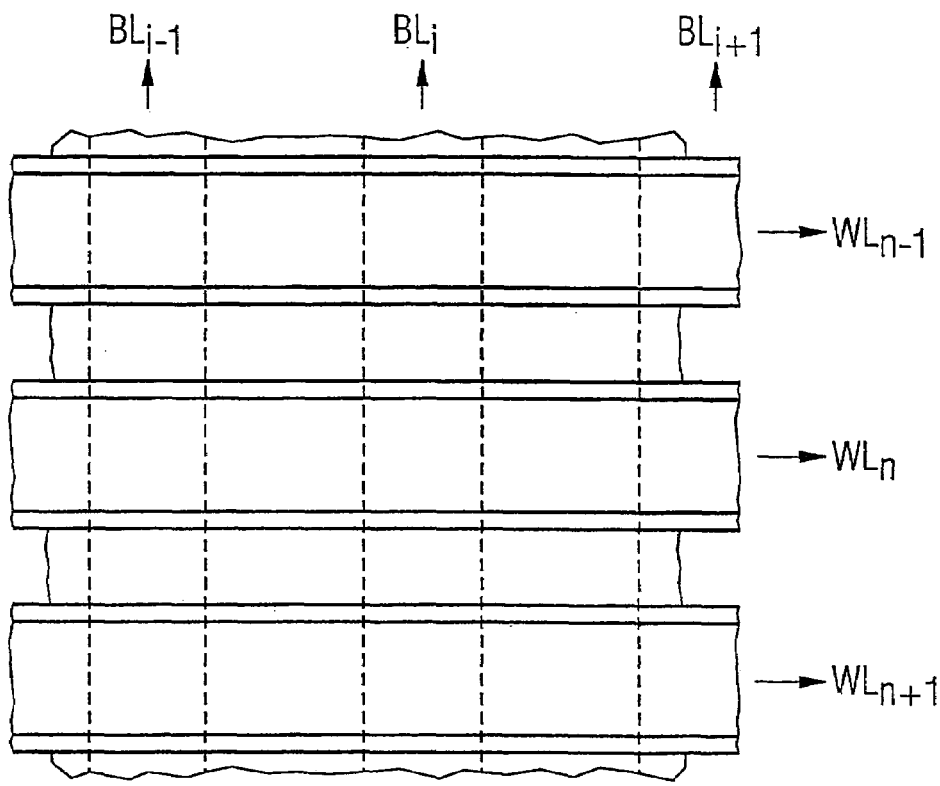
FIG. 0 shows a diagrammatic arrangement of the word lines and bit lines in plan view.

The following list of reference symbols can be used in conjunction with the figures

| | |
|---|---|
| 1 | Semiconductor body |
| 2 | Gate electrode |
| 3 | Source/drain region |
| 4 | Source/drain region |
| 5 | Boundary layer |
| 6 | Storage layer |
| 7 | Boundary layer |
| 8 | Bit line |
| 9 | Trench |
| 10 | p-type well |
| 11 | Doped region |
| 12 | Edge insulation |
| 13 | Oxide layer |
| 14 | Polysilicon layer |
| 15 | Metal-containing layer |
| 16 | Hard mask |
| 17 | Spacer |
| 18 | Polysilicon layer |
| 19 | Metal-containing layer |
| 20 | Hard mask layer |
| 21 | Spacer |

-continued

| 22 | Anti-punch implantation |
| 23 | Portion of the channel region |
| 24 | Etched-out region |

DETAILED DESCRIPTION OF ILLUSTRATIVE EMBODIMENTS

German Patent Application No. 101 29 958 (and U.S. counterpart U.S. Pat. Nos. 6,548,861 and 6,794,249) describes a memory cell arrangement provided with low-impedance bit lines. Arranged on doped source/drain regions of memory transistors there is a separate layer or layer sequence, which is patterned in strip form in accordance with the bit lines and, in particular as metallization, is electrically conductively connected to the source/drain regions and reduces the nonreactive resistance of the bit lines. The layer or layer sequence comprises, in particular, at least one material from the group of doped polysilicon, tungsten, tungsten silicide, cobalt, cobalt silicide, titanium and titanium silicide.

If the source/drain regions are formed in silicon, the metallization of the bit lines may be a siliconized metal layer fabricated by the method known by the designation "salicide" as an abbreviation of self-aligned silicide. In other embodiments, preferably likewise on silicon, a layer sequence—applied as metallization—made of polysilicon and WSi or WN/W and also a covering and electrically insulating layer made of a material suitable for a hard mask, for example an oxide or nitride, are present on the source/drain regions of the memory transistors. The metallizations of the bit line structures are patterned directly on the substrate and, as required, in part above oxide-covered regions.

The source/drain regions of the individual memory transistors are fabricated with a source/drain implantation having a high dose or by means of an outdiffusion of dopant from a suitable layer, e.g., from polysilicon. The bit lines are formed with the strip-type metallizations applied on the source/drain regions, the bit lines having a particularly low nonreactive resistance owing to the good conductivity of the metallizations. In this case, a metallizaton is to be understood to be a metal-containing layer or an interconnect having at least metal-like properties. The source/drain regions of the same bit line need not already be electrically conductively connected to one another in the semiconductor material. Preferably, however, the bit lines are formed as buried bit lines with strip-type doped regions in the semiconductor material which are additionally provided with the metallizations.

On the top side remote from the semiconductor material, the bit line structures are preferably encapsulated in nitride layers which are embodied as strips and, in the fabrication method, serve as an etching mask for producing the transistors' channel regions that are self-aligned with respect thereto. After the application of a storage layer, which preferably comprises a layer sequence that is formed from a boundary layer, an actual storage layer and a further boundary layer and is formed in the manner of an ONO layer, a layer sequence for fabricating word lines is deposited and patterned in strip form preferably by means of a dry etching.

The boundary layers are material having a higher energy band gap than the energy band gap of the storage layer, so that the charge carriers trapped in the storage layer remain localized there. A nitride is preferably appropriate as material for the storage layer; an oxide is primarily suitable as the surrounding material. In the case of a memory cell in the material system of silicon, the storage layer in the example of an ONO layer sequence is silicon nitride having an energy band gap of about 5 eV; the surrounding boundary layers are silicon oxide having an energy band gap of about 9 eV. The storage layer may be a different material whose energy band gap is less than the energy band gap of the boundary layers, in which case the difference between the energy band gaps is intended to be as large as possible for good electrical confinement of the charge carriers. In conjunction with silicon oxide as boundary layers, it is possible to use, e.g., tantalum oxide, hafnium silicate, titanium oxide (in the case of stoichiometric composition $TiO_2$), zirconium oxide (in the case of stoichiometric composition $ZrO_2$), aluminum oxide (in the case of stoichiometric composition $Al_2O_3$) or intrinsically conductive (undoped) silicon as material of the storage layer.

Between the channel regions of the transistors of adjacent memory cells, an electrical insulation can be produced by means of an implantation of dopant with a variable angle of incidence, in order to insulate the transistors from one another, a so-called anti-punch implantation. An alternative configuration provides for this insulation to be realized by cutouts filled with oxide; this is done in the manner of an STI (shallow trench isolation).

FIG. 0 diagrammatically illustrates an arrangement made of word lines $WL_{n-1}$, $WL_n$, $WL_{n+1}$ and bit lines $BL_{i-1}$, $BL_i$, $BL_{i+1}$ in a plan view. In this case, the bit lines are present as buried bit lines and depicted as concealed contours by means of broken lines. The word lines are provided as preferably metallic interconnects on the topside of the arrangement. A memory cell of the memory is arranged in a respective crossover position between a bit line intermediate region and a word line (crosspoint cell). The memory cell that is respectively to be read or programmed is addressed via the bit lines and word lines in the manner known per se. The totality of the memory cells with the illustrated connections by bit lines and word lines form a memory with virtual-ground NOR architecture.

Figure 1:
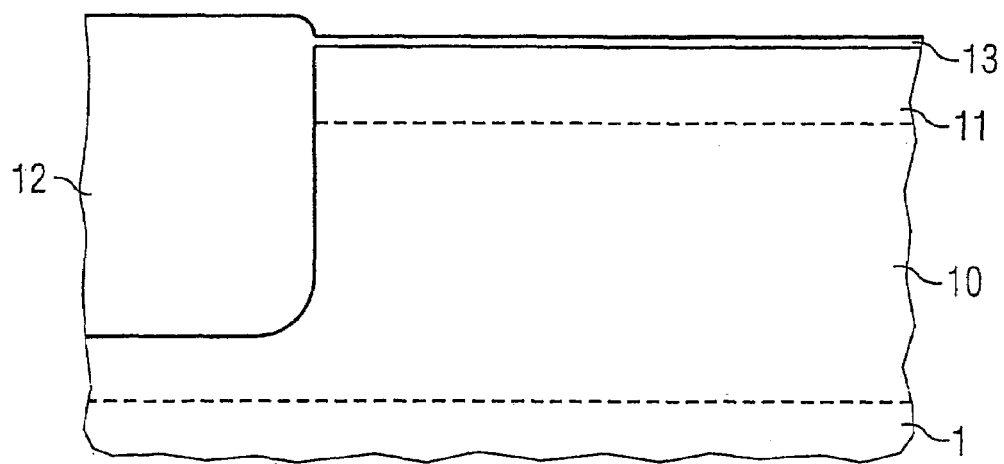

FIG. 1 illustrates a first intermediate product of the fabrication of such a memory in a cross section. It is customary for the top side of the semiconductor material of a semiconductor body 1 used, e.g., of a substrate made of silicon, or of a semiconductor layer or semiconductor layer sequence grown on a substrate, firstly to be covered with a so-called pad oxide (screen oxide) and pad nitride. Trenches are etched into the semiconductor material, which trenches are filled with an oxide as STI (shallow trench isolation) and are provided for delimiting the memory cell array (edge insulation 12) or individual memory blocks and, if appropriate, for the purpose of insulation between the memory cells. After planarization, the pad nitride is removed by means of an etching. With the use of silicon as semiconductor material, p-type wells and n-type wells, i.e., doped regions which reach deeply into the semiconductor material and are provided for the driving periphery and the memory cells, are fabricated preferably by means of masked boron implantations and phosphorus implantations with subsequent annealing of the implants. FIG. 1 illustrates a p-type well 10 formed in the semiconductor body 1.

After the removal of the initially applied pad oxide, an oxide layer 13 having a suitable thickness is grown, which later serves as an etching stop layer outside the memory cell array. During this fabrication process, an implantation (e.g., phosphorus) is then introduced by means of suitable phototechnology, which implantation forms a region 11 doped in highly n-conducting fashion ($n^+$-type region) in an upper portion of the p-type well 10 which is provided for the source/drain regions that are later to be fabricated. The signs of the dopings may also be interchanged ($p^+$-type region in an n-type well). In the region of the memory cell array, the oxide layer 13, which is not necessary for forming the memory cell, is removed wet-chemically preferably using the same photomask.

Figure 2A:
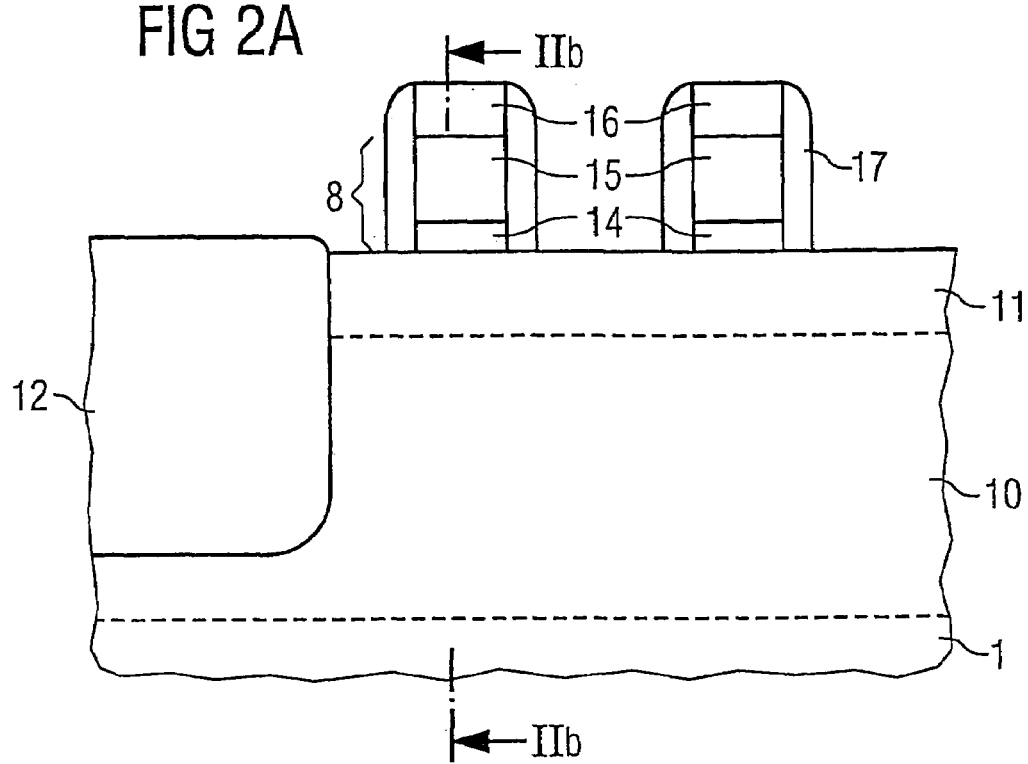

FIG. 2a represents the cross section illustrated in FIG. 1 after the application and patterning of a layer sequence with the strip-type bit line 8. Firstly, for the contact connection of the source/drain regions, a polysilicon layer 14 of the associated sign of the conductivity type is applied and then a metal-containing layer 15, for example tungsten silicide (WSi), is applied as an actual low-impedance bit line and, afterward, a material of hard mask 16 (e.g., an oxide or nitride) is applied for the purpose of electrical insulation. These layers are then patterned in strip form preferably by means of a phototechnology and anisotropic etching. Instead of the WSi, it is possible to apply a layer sequence made of tungsten nitride and tungsten. The electrically conductive layer may also have titanium and/or titanium silicide. The strip-type bit lines 8 are laterally insulated by spacers 17, preferably made of an oxide or nitride.

Figure 2B:
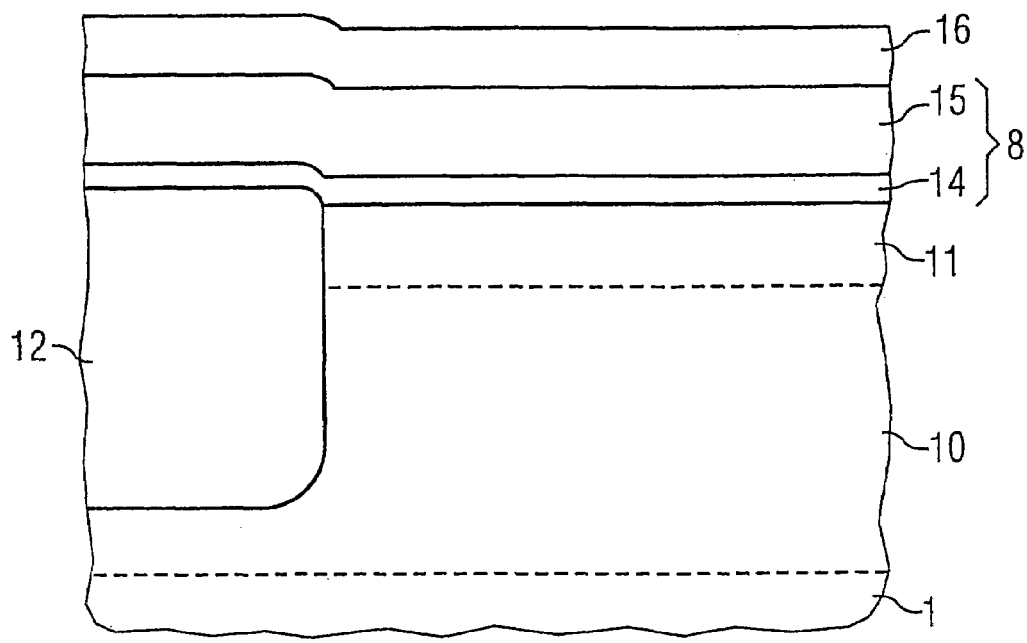

FIG. 2b illustrates the section designated in FIG. 2a. It reveals that the bit line 8 is lengthened laterally beyond the edge insulation 12, so that it can be contact-connected outside the actual memory cell array. The etching process for the strip-type patterning of the layers is delimited at the edge of the cell array by the edge insulation 12. Buried portions of the bit lines that may be present in addition to the source/drain regions as doped semiconductor material end in each case at the edge insulation 12.

Figure 3:
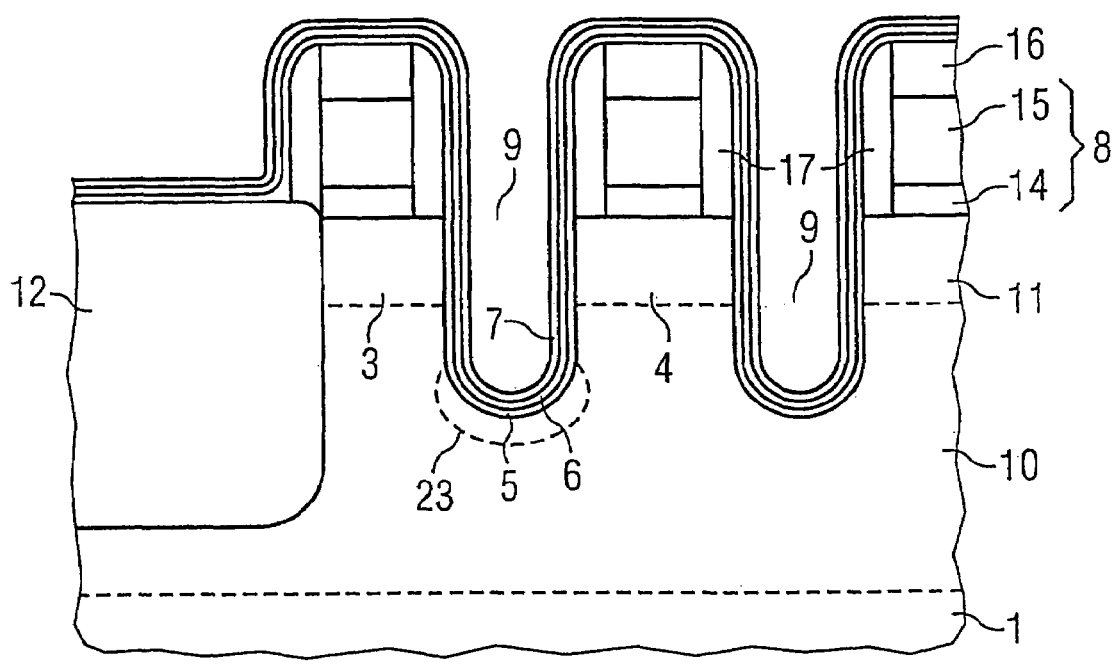

Using the bit line structures on the top side and the oxide- or nitride-covered regions as mask, trenches 9 are etched (e.g., by means of reactive ion etching, RIE), as illustrated in FIG. 3, in a self-aligned manner, which trenches are provided for the active regions, in particular the individual memory cells. The source/drain regions 3, 4 are formed in between. It must additionally be taken into account that, for good functioning (performance), the charge carrier concentration respectively present at a specific gate voltage in a portion of the channel region of the memory transistor that is provided at the bottom of the trench must be sufficiently high; that is the electron concentration in the case of a p-type well. In an advantageous configuration in which the well 10 of the memory cell has a typical dopant concentration of $10^{17}$ cm$^{-3}$, a doped region 23 is therefore formed by means of an implantation into the bottom of the trench, which doped region changes the dopant concentration of the channel region to a greater extent in the center than in the lateral outer regions. To that end, preferably a sacrificial layer is firstly applied (e.g., sacrificial oxide, typically about 6 nm thick, produced thermally). The dopant provided is then implanted; in the specified example of a p-doped well, that is arsenic as dopant having an energy of, for example, typically 20 keV in a dose of $10^{12}$ cm$^{-3}$ to $10^{14}$ cm$^{-3}$. The sacrificial layer is removed; this can be done using dilute HF in the case of an oxide.

A layer sequence comprising a lower boundary layer 5, a storage layer 6 and an upper boundary layer 7 is applied over the whole area. This layer sequence is provided as the actual storage medium and may be, as described in the introduction, e.g., an ONO layer sequence known per se. In this case, the lower boundary layer 5 may be, for example, an oxide having a thickness of about 2.5 nm to 8 nm (bottom oxide, preferably produced thermally), the storage layer 6 may be a nitride having a thickness of about 1 nm to 5 nm (preferably deposited by means of LPCVD, low pressure chemical vapor deposition) and the upper boundary layer 7 may likewise be an oxide, having a thickness of about 3 nm to 12 nm.

The structure thus achieved is illustrated in cross section in FIG. 3. The memory cell array is covered by means of suitable phototechnology, so that the storage layer including the boundary layers can be removed in the region of the periphery, which is fabricated for example in the context of a CMOS process. The storage layer may also be removed in the region of the memory on the bottoms of the trenches 9 provided for the gate electrodes and/or between the trenches 9, so that the storage layer is interrupted between the walls of a respective trench and/or between two mutually adjacent trenches. For the driving periphery, the gate oxide is grown for high-voltage transistors and then possibly a thinner gate oxide is grown for low-voltage transistors. The threshold voltages can be set using further masks and implantations.

In the cross section illustrated in FIG. 4a, the structure is illustrated after the deposition of a conductively doped polysilicon layer 18 provided for the gate electrodes 2 and of a metal-containing layer 19 (here WSi) provided for the word line and of a hard mask layer 20. The polysilicon is deposited with a thickness of typically 80 nm and is preferably doped in situ and is provided for the gate electrodes. The actual word lines are formed by the low-impedance metallic or metal-containing material of the metal-containing layer 19. Instead of tungsten silicide, a silicide of a different metal or a multilayer metal-containing layer may be present. The material of the hard mask layer 20 is, e.g., a densified oxide.

FIG. 4b and FIG. 4c illustrate the sectional views depicted in FIG. 4a. In the cross section of FIG. 4b, the layer sequence of the storage layer 6 is situated between the boundary layers 5, 7 above the bit line 8, which, in this example, is formed from the polysilicon layer 14 and the metal-containing layer 15, and insulated therefrom by the hard mask 16. FIG. 4c illustrates a section through the gate electrodes 2 between two bit lines, where the storage layer 6 runs at the bottom of the trenches provided for the gate electrodes. As can be discerned in FIGS. 4b and 4c, the applied layer sequence made of the polysilicon layer 18, the metal-containing layer 19 and the hard mask layer 20 is patterned in strip form, so that word lines running transversely with respect to the bit lines are formed. The sidewalls of the word lines are insulated by spacers 21. The spacers are formed in the manner known per se by a layer comprising the material of the spacers being applied isotropically over the whole area and being etched back anisotropically in such a way that essentially only the high vertical portions of the spacers 21 remain at the sidewalls of the word lines etched in strip form. The interspaces between the gate electrodes below the word lines may, instead, remain filled entirely or partly with the material of the spacers.

The gate electrodes of the transistors of the driving periphery may be patterned at the same time in this method step. In the region of the memory cell array, the etching of the gate electrodes stops on the upper boundary layer 7 or the ONO layer sequence. In a supplementary manner, a gate reoxidation may be effected and, as required, an anti-punch implantation 22 may be introduced for the insulation of adjacent transistors.

Further customary method steps known per se for the fabrication of the transistors may equally be provided, such as, e.g., LDD implantations (lightly doped drain) and HDD implantations or a deposition of a passivation made of nitride and a planarization by means of BPSG (borophosphosilicate glass) and CMP. Further steps for completion consist in the fabrication and filling of contact holes (via holes) and the fabrication of metallizations and passivations. These fabrication steps are known per se from the fabrication of memory components.

FIG. 5a illustrates a diagram concerning a model calculation in which the lateral dimension in the plane of the drawing of FIG. 3 is plotted on the abscissa and the distance d from the top side of the semiconductor body or a specific layer within the semiconductor body is plotted in μm on the ordinate. Lines of identical dopant concentration for a typical exemplary embodiment of the doped region 23 are entered in the region of the semiconductor material of the trench bottom.

In the associated FIG. 5b, the respective ordinate value d/μm from FIG. 5a is transferred to the abscissa. The dopant concentration D in $cm^{-3}$ (number of dopant atoms per cubic centimeter) is plotted on the ordinate. The vertical broken lines mark the boundaries between the boundary layers 5, 7 and the storage layer 6. The graphs for the dopant concentrations of arsenic and boron are shown in a solid and dashed depiction, respectively. In this example, the boron concentration is constant at $10^{17}$ $cm^{-3}$, ideally constant at $2 \cdot 10^{17}$ $cm^{-3}$, and may also be $3 \cdot 10^{17}$ $cm^{-3}$; however, it is weakened somewhat by the diffusion of boron atoms into the dielectric of the boundary layer 5 in the region of the abscissa value around approximately 0.3 μm. In the preferred exemplary embodiments, below the lower boundary layer 5, a dopant concentration of the arsenic of $5 \cdot 10^{17}$ $cm^{-3}$ to $5 \cdot 10^{18}$ $cm^{-3}$ is set in a region below the deepest point of the trench bottom, which reaches into the semiconductor material to a depth of up to 20 nm, (dimension $R_1$ in FIG. 5b). This can be done in particular by means of an arsenic implantation with a dose of typically about $2 \cdot 10^{12}$ $cm^{-2}$ at an energy of 20 keV (as already specified above using a screen oxide having a thickness of about 6 nm that is subsequently to be removed). The region R of the dopant concentrations thus set is marked on the ordinate in FIG. 5b.

In the case of a boron concentration that is higher by a specific factor as basic doping of the semiconductor material or as well doping, the specified limits for the arsenic concentration are to be multiplied by this factor. Thus, a dopant concentration is set in that part of the doped region 23 which is situated at the portion projecting furthest into the semiconductor material in the center of the bottom of the trench and reaches 20 nm vertically with regard to the bottom of the trench into the semiconductor material, the value of which dopant concentration lies in a range whose limits are determined by $5 \cdot 10^{17}$ $cm^{-3}$ and $5 \cdot 10^{18}$ $cm^{-3}$, in each case multiplied by a quotient of a concentration of a dopant which is introduced into the semiconductor material in this region as basic doping or well doping, measured in $cm^{-3}$, and the value $10^{17}$ $cm^{-3}$. Dopants other than those specified are also appropriate as dopants, under the proviso that the conductivity types produced therewith have the appropriate sign in each case.

The area occupied by the memory cell arrangement can be reduced by dispensing with an electrical insulation between the cells, e.g., by means of STI (shallow trench isolation), within the cell array. What is problematic with continued miniaturization of the feature size, however, is the electrical isolation of the individual memory cells at mutually adjacent word lines. In particular, the doped regions 23 for setting the charge carrier concentration in the channel region at the bottoms of the trenches 9 are the cause of an electrically conductive connection in the substrate or at least of undesirable crosstalk between mutually adjacent rows of memory cells. An insulation implantation between the word lines does not appear to be suitable for effectively eliminating this crosstalk.

Figure 6:
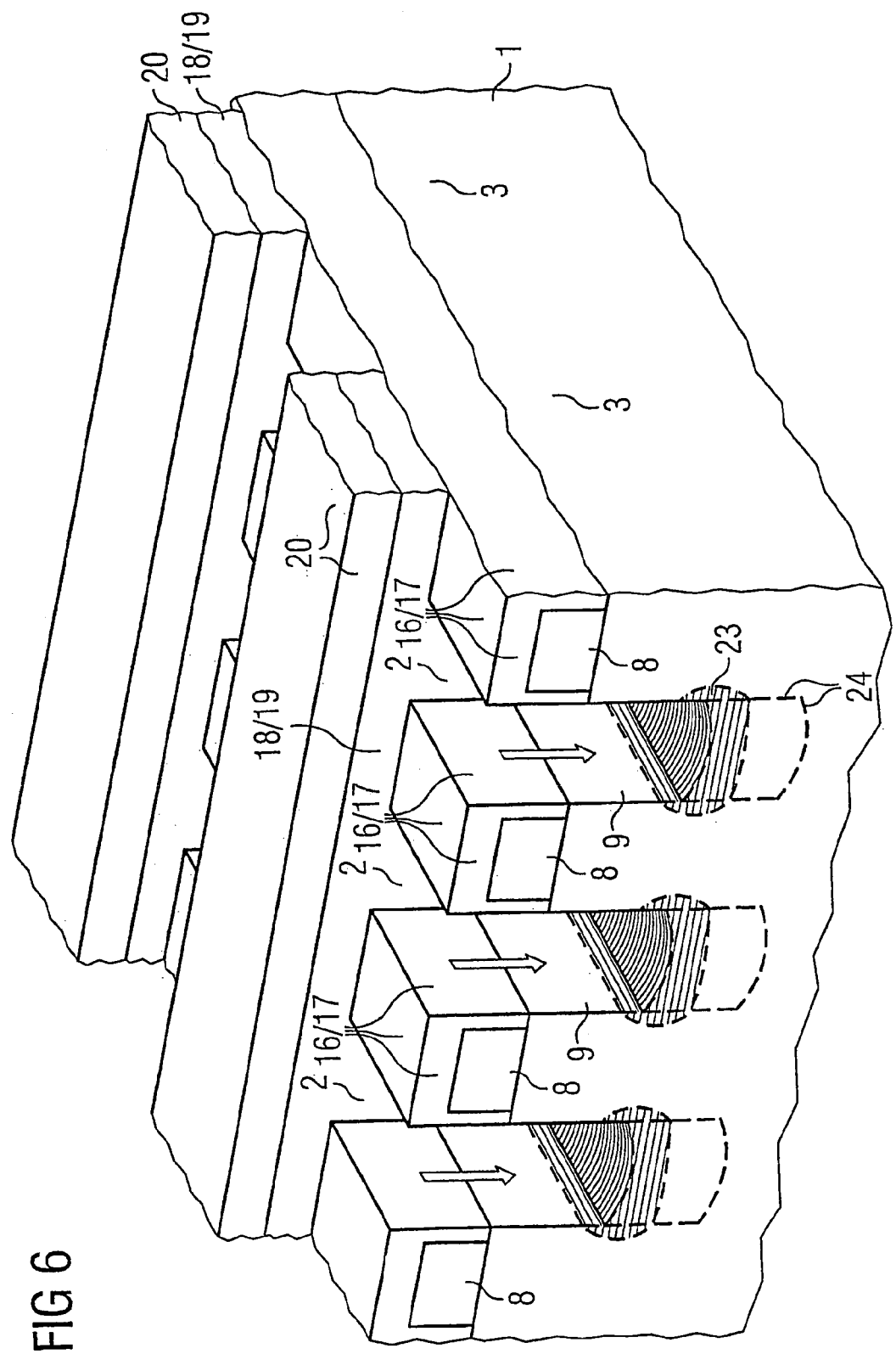
FIG. 6 shows an oblique sectional view after the fabrication of the word lines.

FIG. 6 shows, in an oblique plan view, an intermediate product of the fabrication method that is obtained after the fabrication of the word lines. In this case, the method encompasses all alternative configurations which lead to the basic structure in accordance with FIG. 6. All that is essential in this case is that, between the trenches provided for the memory transistors, the source/drain regions are formed in the semiconductor material and are connected to bit lines 8 arranged on the top side of the semiconductor material. The bit lines 8 are electrically insulated from the material of the word lines 18/19 by means of electrically insulating material of a covering layer 16/17, e.g., a hard mask applied on the top side during the fabrication and laterally arranged spacers. Within the trenches 9, the material of the word lines forms the gate electrodes 2 of the memory transistors. There is present on the top side of the word lines, e.g., a hard mask layer 20, which has also been used for the strip-type patterning of the word lines 18/19. As can be gathered from the illustration, an electrical insulation between the word lines, e.g., by STI isolation trenches, has been dispensed with in the method. Therefore, the trenches 9 are open between the gate electrodes 2.

The doped regions 23, provided for setting the charge carrier concentration in the channel region, are situated at the bottoms of the trenches. In order to identify the doped regions 23, these regions have been depicted in each case with hatching in FIG. 6. In this case, however, a sectional area is depicted only in the front plan view, while the remaining hatched areas represent the bottoms of the trenches and the bottommost portions of the trench walls. In order to improve the electrical insulation between the mutually adjacent memory cells in the direction of the bit lines 8, cutouts are etched into the semiconductor material of the trench bottoms proceeding from the illustrated structure between the word lines in the direction of the depicted arrows, thereby forming the etched-out regions 24. Depending on the lateral dimensioning of the doped regions 23, the doped regions 23 can be removed completely or only to a substantial extent during the etching process. The lateral portions of the doped regions 23 illustrated in the drawing are removed, e.g., if the etching carried out in the region of the trench bottom laterally expands the etched-out region. A strictly anisotropic etching in the direction of the indicated arrows is assumed in the diagrammatic illustration of FIG. 6. However, depending on the process implementation, the etched-out regions 24 can be laterally expanded in such a way that the lateral portions of the doped regions 23 are also completely removed.

Depending on the type of dopant profile in the doped regions 23, it may also suffice to set an etching depth smaller than that illustrated in FIG. 6. A typical value for the etching depth by which the trench bottom is lowered between the word lines is about 80 nm. The etching is effected in a self-aligned manner, so that there is no need for a further mask and an additional lithography step. The word lines and the electrical insulations on the top side of the bit lines 8 (preferably nitride) serve as a mask during the etching step. A covering layer made of nitride on the top side of the bit lines 8 (e.g., the hard mask 16) is typically fabricated with a thickness of 100 nm.

What is claimed is:

1. A method for fabricating an NROM memory cell array, the method comprising:
   providing a semiconductor body;
   introducing an implantation of dopant at a top side of the semiconductor body in order to form source/drain regions;
   etching trenches into the semiconductor material, the trenches being arranged parallel at a distance from one another;
   forming a plurality of bit lines on the top side of the semiconductor body, the bit lines running parallel to the trenches and each bit line arranged between two adjacent trenches, each bit line being electrically conductively connected to source/drain regions located between the adjacent trenches;
   providing a covering layer for electrical insulation on the top side of the semiconductor body;
   implanting a dopant into the semiconductor body at bottoms of the trenches in order to form a doped region that affects electrical properties of a channel region provided there;
   applying a storage layer at least at walls of the trenches;
   arranging gate electrodes in the trenches at predetermined distances, the gate electrodes being electrically conductively connected to word lines that are applied in a manner such that they run transversely with respect to the direction of the bit lines, wherein the dopant at the bottoms of the trenches remains between the word lines; and
   in regions between the word lines, etching away the semiconductor body at the bottoms of the trenches to an extent such that the doped regions between the word lines are at least partially removed.

2. The method as claimed in claim 1 wherein etching away the semiconductor body at the bottoms of the trenches comprises etching away at the bottoms of the trenches to an extent such that the doped regions between the word lines are removed entirely.

3. The method as claimed in claim 1 wherein etching away the semiconductor body at the bottoms of the trenches comprises etching away at the bottoms of the trenches to an extent such that the doped regions between the word lines are removed to such a large extent that a crosstalk between adjacent memory cells along the trenches is reduced.

4. The method as claimed in claim 1, wherein the etching away the semiconductor body at the bottoms of the trenches comprises etching the semiconductor body at the bottoms of the word lines by at least 80 nm.

5. The method as claimed in claim 1, wherein providing a covering layer comprises applying a nitride layer over the bit lines.

6. The method as claimed in claim 5, wherein the nitride layer is used as a mask during the etching of the trenches.

7. A method for fabricating an NROM memory cell array, in which, at a top side of a semiconductor body, an implantation of dopant is introduced in order to form source/drain regions, trenches arranged parallel at a distance from one another that are etched into the semiconductor material and a bit line running parallel to the trenches arranged between said trenches on the top side of the semiconductor body, wherein the bit line is electrically conductively connected to the source/drain regions present between adjacent trenches, on the top side, the semiconductor body is provided with a covering layer for electrical insulation, an implantation of dopant is in each case introduced into the semiconductor material at the bottoms of the trenches in order to form a doped region that modifies the electrical properties of a channel region provided there, a storage layer is applied at least at the walls of the trenches, gate electrodes are arranged in the trenches at predetermined distances and said gate electrodes are electrically conductively connected to word lines applied in a manner such that they run transversely with respect to the direction of the bit lines and the dopant at the bottoms of the trenches remains between the word line,
   wherein, in regions between the word lines, the semiconductor material is etched away at the bottoms of the trenches to an extent such that the doped regions between the word lines are at least partially removed.

8. The method as claimed in claim 7 wherein the semiconductor material is etched away at the bottoms of the trenches to an extent such that the doped regions between the word lines are removed entirely.

9. The method as claimed in claim 7 wherein the semiconductor material is etched away at the bottoms of the trenches to an extent such that the doped regions between the word lines are removed to such a large extent that a crosstalk between adjacent memory cells along the trenches is reduced.

10. The method as claimed in claim 7, wherein the semiconductor material etched away at the bottoms of the trenches between the word lines is etched to a depth of at least 80 nm beyond the bottoms of the trenches.

11. The method as claimed in claim 7, wherein nitride is applied to the bit lines as the covering layer, and said nitride layer is used as a mask during the etching of the trenches.

* * * * *

UNITED STATES PATENT AND TRADEMARK OFFICE
CERTIFICATE OF CORRECTION

PATENT NO. : 7,323,383 B2  Page 1 of 1
APPLICATION NO. : 11/015747
DATED : January 29, 2008
INVENTOR(S) : Deppe et al.

It is certified that error appears in the above-identified patent and that said Letters Patent is hereby corrected as shown below:

In Col. 10, line 26, delete "line" and insert --lines--.

Signed and Sealed this

Twenty-fourth Day of June, 2008

JON W. DUDAS
*Director of the United States Patent and Trademark Office*